US006605149B2

(12) United States Patent
Arvidson

(10) Patent No.: US 6,605,149 B2
(45) Date of Patent: Aug. 12, 2003

(54) METHOD OF STACKING POLYCRYSTALLINE SILICON IN PROCESS FOR SINGLE CRYSTAL PRODUCTION

(75) Inventor: Arvid Neil Arvidson, Midland, MI (US)

(73) Assignee: Hemlock Semiconductor Corporation, Hemlock, MI (US)

( * ) Notice: Subject to any disclaimer, the term of this patent is extended or adjusted under 35 U.S.C. 154(b) by 0 days.

(21) Appl. No.: 10/042,684

(22) Filed: Jan. 11, 2002

(65) Prior Publication Data

US 2003/0131783 A1 Jul. 17, 2003

(51) Int. Cl.[7] .......................... C30B 28/00; C30B 28/10
(52) U.S. Cl. ................... 117/13; 117/11; 117/18
(58) Field of Search ................... 117/13, 18, 11

(56) References Cited

U.S. PATENT DOCUMENTS

| | | | | |
|---|---|---|---|---|
| 4,073,666 A | * | 2/1978 | Marancik et al. | 148/98 |
| 4,955,357 A | * | 9/1990 | Takeguchi et al. | 125/23.01 |
| 5,268,663 A | * | 12/1993 | Takeuti et al. | 336/212 |
| 5,588,993 A | | 12/1996 | Holder | 117/13 |
| 5,919,303 A | | 7/1999 | Holder | 117/13 |
| 6,110,272 A | * | 8/2000 | Aikawa et al. | 117/13 |
| 6,284,040 B1 | * | 9/2001 | Holder et al. | 117/13 |

OTHER PUBLICATIONS

"Historical Overview of Silicon Crystal Pulling Development", Werner Zulehner, Materials Science & Enginering, pp. 7–15, 2000.

* cited by examiner

Primary Examiner—Benjamin L. Utech
Assistant Examiner—Matt Song
(74) Attorney, Agent, or Firm—Catherine U. Brown

(57) ABSTRACT

A process forms a single crystal silicon ingot from varying sized pieces of polycrystalline silicon source material according to the Czochralski method. The process comprises placing into a crucible on the bottom a generally polygonal-shaped concentric array of rod-shaped polycrystalline silicon pieces having obliquely cut ends. The method of stacking the polycrystalline silicon pieces in the crucible allows for a denser packing of silicon in the crucible, can be accomplished in a quicker time then conventional packing methods, and has the potential for less damage to the crucible bottom, when comparing to standard packing methods using a size assortment of irregular shaped silicon pieces.

22 Claims, 3 Drawing Sheets

METHOD OF STACKING POLYCRYSTALLINE SILICON IN PROCESS FOR SINGLE CRYSTAL PRODUCTION

FIELD OF THE INVENTION

A process for forming a single crystal silicon ingot from varying sized pieces of polycrystalline silicon source material according to the Czochralski method. More specifically, the present invention relates to a method of stacking polycrystalline silicon pieces into a crucible for single crystal silicon production by the Czochralski method.

BACKGROUND OF THE INVENTION

Most semiconductor chips used in electronic devices are fabricated from single crystal silicon prepared by the Czochralski process. In this process, a single crystal silicon ingot is produced by melting polycrystalline silicon source material stacked within a quartz crucible, stabilizing the crucible and source melt at an equilibrium temperature, dipping a seed crystal into the source melt, withdrawing the seed crystal as the source melt crystallizes on the seed to form a single crystal ingot, and pulling the ingot as it grows. Melting occurs at a temperature of 1420° C. in an inert gas environment at low pressure. The crucible is continually rotated about a generally vertical axis as the crystal grows. The rate at which the ingot is pulled from the source melt is selected to form an ingot having a desired diameter. The polycrystalline silicon melted to form the molten silicon is typically irregularly shaped chunks prepared by the Siemens process and subsequently broken into suitably sized pieces.

The initial charging of chunk type polycrystalline silicon placed into the crucible and the melting thereof can introduce undesirable impurities and subsequently contributes to defects in the single crystal ingot. For example, when a crucible is initially charged with chunk polycrystalline silicon the edges of the chunks under the load of a full charge can scratch and gouge the crucible wall resulting in a damaged crucible and in particles of crucible floating on or being suspended in the silicon melt. These impurities significantly increase the likelihood of dislocations forming within the single crystal, and decrease the dislocation-free single crystal production yields and throughput. Additionally, initial loadings of 100% irregularly shaped chunk polycrystalline silicon limits the volume of material which can be charged due to the poor packing densities of such chunk materials. The volume limitation directly impact single crystal throughput in the Czochralski-type process.

Holder et al., U.S. Pat. No. 6,284,040, disclose a process for forming a single crystal silicon ingot from varying sized chunks of polycrystalline silicon according to the Czochralski method which includes classifying each chunk of silicon by size and placing the chunks according to size classification within at least three regions of the crucible.

Holder et al., U.S. Pat. No. 5,588,993, disclose a process for forming a single crystal silicon ingot by the Czochralski method. In the preferred method, chunks of polycrystalline silicon are first loaded into a crucible forming a central depression therein, a partial melt is formed, and particulate polycrystalline silicon is fed into the unmelted region of the central depression.

Holder, U.S. Pat. No. 5,919,303, describes a process for preparing a silicon melt from a polysilicon charge by the Czochralski method where a crucible is loaded with chunk polysilicon to form a charge having a bowl-like shape, where initially the load generally slopes radially upwardly and outwardly from the centerline toward the sidewall formation to an apex and then slopes generally downwardly and outwardly from the apex to the sidewall formation. The bowl-shaped chunk polysilicon charge is heated to form a partially melted charge, and granular polysilicon is fed onto the partially melted charge to form a mixed charge of chunk and granular polysilicon.

The present method of stacking the polycrystalline silicon pieces in the crucible allows for a denser packing of silicon in the crucible, can be accomplished in a quicker time then conventional packing methods, and has the potential for less damage to the crucible bottom, when compared to standard packing methods using a size assortment of irregular shaped silicon pieces.

SUMMARY OF THE INVENTION

A process for forming a single crystal silicon ingot from varying sized pieces of polycrystalline silicon source material according to the Czochralski method is disclosed. In one embodiment of the invention, the process comprises placing into a crucible on the bottom a generally polygonal-shaped concentric array of rod-shaped polycrystalline silicon pieces having obliquely cut ends. In an alternative embodiment of the invention, the process comprises placing into a crucible on the bottom a generally parallel array of rod-shaped polycrystalline silicon pieces having obliquely cut ends.

DESCRIPTION OF THE INVENTION

The present invention is a process for forming a single crystal silicon ingot from varying sized pieces of polycrystalline silicon source material according to the Czochralski method. In one embodiment of the invention, the process comprises placing into a crucible on the bottom a generally polygonal-shaped concentric array of rod-shaped polycrystalline silicon pieces having obliquely cut ends. In an alternative embodiment of the invention, the process comprises placing into a crucible on the bottom a generally parallel array of rod-shaped polycrystalline silicon pieces having obliquely cut ends. The method of stacking the polycrystalline silicon pieces in the crucible allows for a denser packing of silicon in the crucible, can be accomplished in a quicker time then conventional packing methods, and has the potential for less damage to the crucible bottom, when compared to standard packing methods using a size assortment of irregular shaped silicon pieces.

The polycrystalline silicon source material used in the present process can be prepared by standard processes known in the semiconductor industry for preparing high-purity silicon for semiconductor use. A preferred process is the chemical vapor deposition of a hyper-pure silane such as trichlorosilane onto a heated silicon core element. This type process typically results in an essentially round rod-shaped element, which can be cut into rod-shaped polycrystalline silicon pieces having obliquely cut ends.

Figure 1:
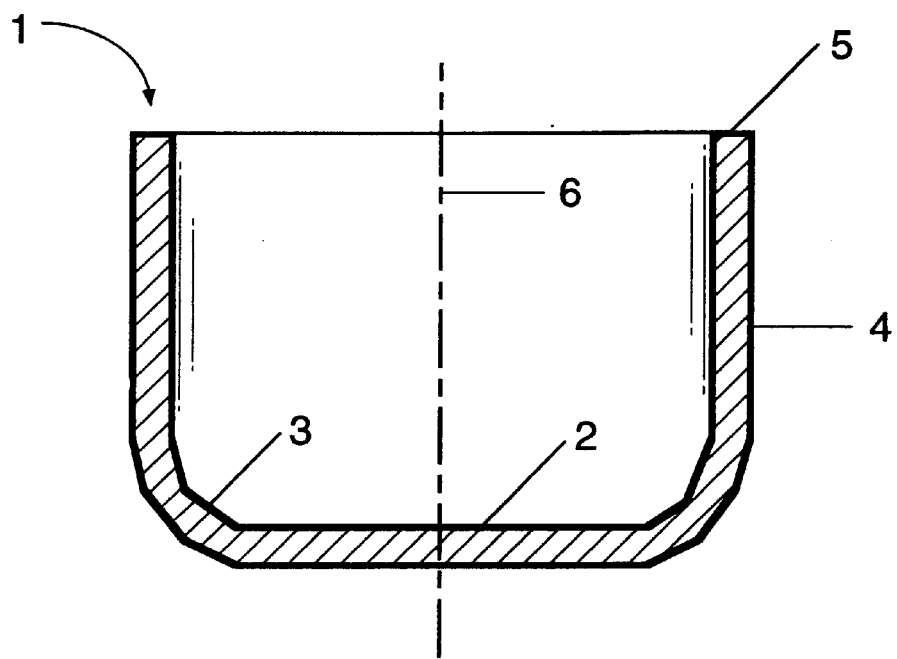
FIG. 1 is a sectional view of an empty Czochralski crucible.

The present invention will now be explained in greater detail by reference to FIGS. 1–5. FIG. 1 shows a sectional view of an empty Czochralski crucible. While the particular geometry of the crucible is not narrowly critical, it will generally be of a circular bowl-shape having inner and outer surfaces which define an at least partially opened structure capable of containing molten silicon. Such a vessel is typically made from quartz glass (i.e. vitreous silica). Crucible 1 generally has an inner surface comprising bottom portion 2, corner portion 3, sidewall 4, top edge 5 and a centerline 6. The inner surfaces define an open cavity into which polycrystalline silicon pieces are placed.

Figure 2:
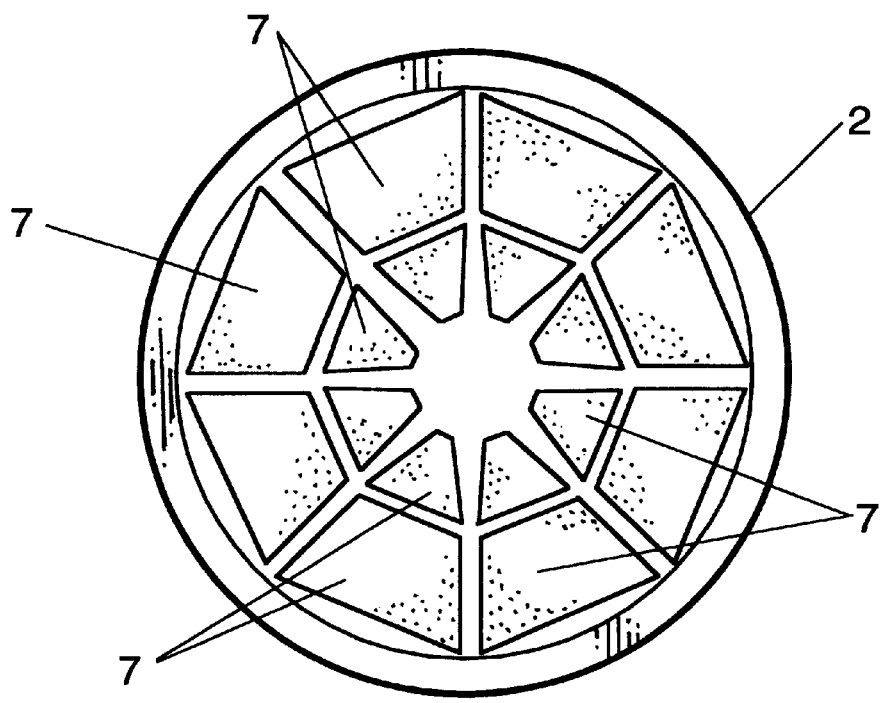
FIG. 2 is a top view of a Czochralski crucible having positioned therein two generally polygonal-shaped concentric arrays of rod-shaped polycrystalline silicon pieces having obliquely cut ends.

FIG. 2 is a top view of a Czochralski crucible having positioned therein two generally polygonal-shaped concentric arrays of rod-shaped polycrystalline silicon pieces having obliquely cut ends (referred to herein in the alternative as cut rods 7). In FIG. 2, cut rods 7 are placed on bottom portion 2 forming a first concentric array orientated around centerline 6 and immediately adjacent to sidewall 4. A second concentric array is positioned on bottom portion 2, orientated around centerline 6, adjacent to the inside wall of the octagonal cavity formed by the first concentric array.

Figure 3A:
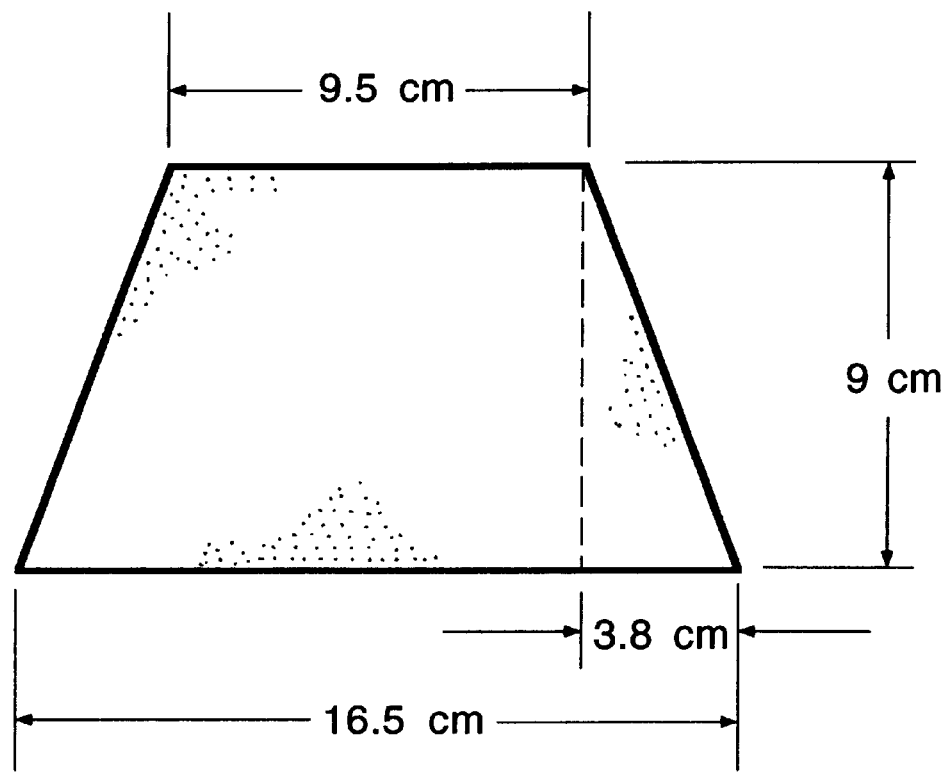
FIGS. 3a and 3b are views of rod-shaped polycrystalline silicon pieces having obliquely cut ends.
Figure 3B:
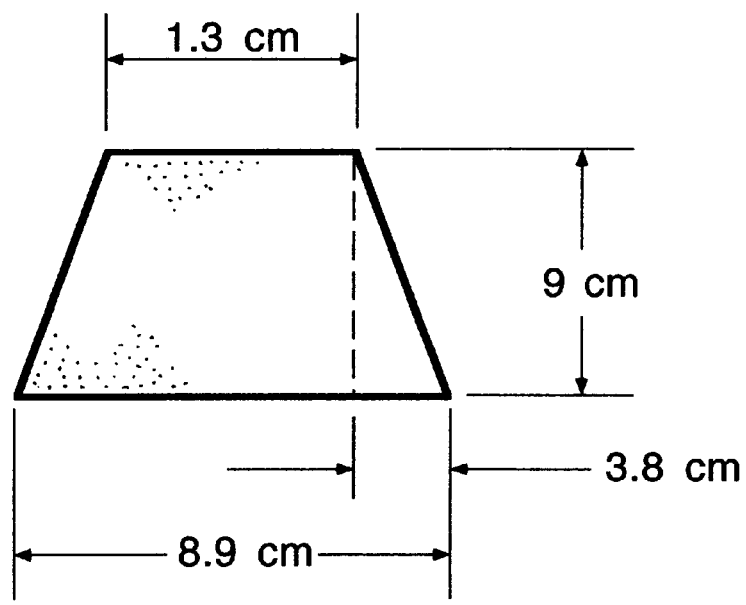

FIGS. 3a and 3b are elevational views of rod-shaped polycrystalline silicon pieces having obliquely cut ends (cut rods 7). The dimensions for cut rods 7 as given in FIGS. 3a and 3b are those suitable for placing in a preferred configuration in a crucible having an inside diameter of about 45 cm. Those skilled in the art will recognize that such dimensions for cut rods 7 can be modified to accommodate crucibles of different sizes. Generally it is preferred that the oblique cut ends of cut rod 7 be cut at such an angle that when a concentric array of cut rods 7 are arrange around a centerline of a crucible, the faces of opposing oblique cut ends are substantially parallel to each other. In a preferred embodiment of the present invention each concentric array of cut rods 7, is formed from 6 to 8 pieces thereby forming a hexagon, heptagon, or octagon shape. An octagon shape is most preferred. One or more polygonal arrays of cut rods may be stacked on top of those arrays placed on the bottom of the crucible. However, due to the weight of the cut rods, this is not generally advised since shifting of the cut rods during the melting process can result in damage to the crucible. The method of cutting rod-shaped polycrystalline silicon element to form cut rods 7 having obliquely cut ends is not critical and can be those methods typically used to cut silicon, such as ban saw, wire saw, or chop saw.

Figure 4:
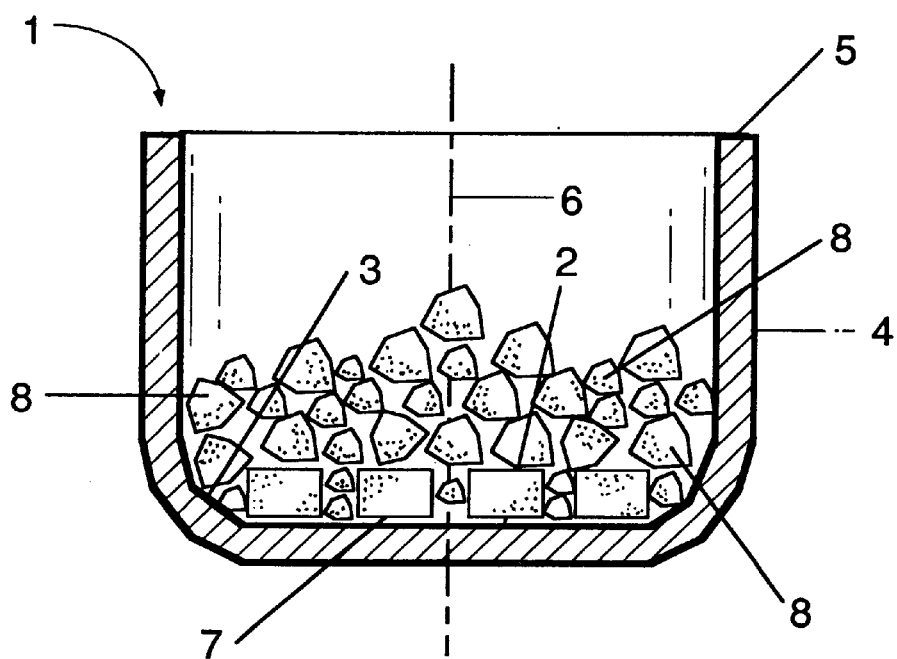
FIG. 4 is a sectional view of a Czochralski crucible having positioned on the inside bottom a generally polygonal-shaped concentric array of rod-shaped polycrystalline pieces having obliquely cut ends and having stack around and thereon irregular shaped pieces of polycrystalline silicon pieces.

FIG. 4 is a sectional view of a Czochralski crucible having positioned on bottom portion 2 a generally polygonal-shaped concentric array of cut rods 7 and having stacked around and thereon irregular shaped pieces of polycrystalline silicon (hereafter in the alternative irregular silicon pieces 8. Such irregular silicon pieces 8 may be at least about 1 mm, alternatively at least about 6 mm in largest dimension. Alternatively, such irregular silicon pieces 8 may have a largest dimension of about 125 mm, alternatively about 50 mm, alternatively about 10 mm. In a preferred process, irregular silicon pieces 8 of about 6 to about 50 mm in largest dimension are used to substantially fill the voids around and between cut rods 7. Then, a mixture of pieces of about 6 mm to about 125 mm in largest dimension can be layered on top to complete stacking of the crucible for forming a melt and performance of the Czochralski method. In an alternative embodiment of the invention, various polycrystalline silicon pieces could be used to fill the voids including, in addition to, or instead of, the irregular silicon pieces described above. Such polycrystalline silicon pieces include substantially spherical silicon beads that generally have diameters of about 1 mm, irregular silicon chunks of about 1 mm to about 10 mm in largest dimension, irregular chunks of about 6 mm to about 50 mm in largest dimension, irregular chunks of about 6 to about 45 mm in largest dimension, irregular chunks with an unspecified size distribution below about 125 mm in largest dimension, combinations thereof, and others.

The method of making irregular shaped pieces 8 is not critical to the present process and can be those generally known in the art, for example polycrystalline silicon logs made by chemical vapor deposition of a silane onto a heated element may be broken by use of a hammer, thermal or sonic shock, or the like. The pieces may then be sized by hand sorting or screening into desired sizes.

Figure 5:
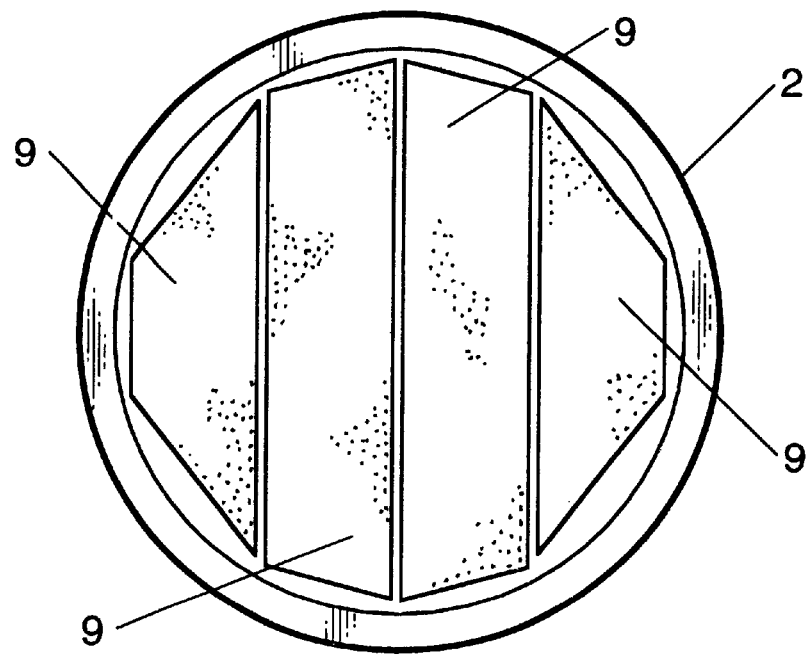
FIG. 5 is a top view of a Czochralski crucible having positioned therein a generally parallel array of rod-shaped polycrystalline silicon pieces having obliquely cut ends.

FIG. 5 illustrates an alternative embodiment of this invention. FIG. 5 is a top view of a Czochralski crucible having positioned therein a generally parallel array of four rod-shaped polycrystalline silicon pieces having obliquely cut ends (referred to herein in the alternative as cut rods 9). In FIG. 5, cut rods 9 are placed on bottom portion 2 of the crucible 1. Cut rods 9 of differing lengths can be arranged such that the bottom portion 2 of the crucible 1 is substantially completely covered. Those skilled in the art will recognize that the dimensions and number of cut rods 9 can be modified to accommodate crucibles of different sizes. However, at least about four cut rods 9 are used. In one embodiment of the invention, up to about six cut rods are used (not shown). One or more layers of generally parallel arrays of cut rods may be stacked on top of the generally parallel array placed on the bottom of the crucible. One skilled in the art would be able to select a suitable number of layers without undue experimentation based on various factors including the weight of the cut rods that will not damage the crucible during the melting process, which can result in shifting of the cut rods. The method of cutting rod-shaped polycrystalline silicon element to form cut rods 9 having obliquely cut ends is not critical and can be those methods typically used to cut silicon, such as ban saw, wire saw, or chop saw.

In one embodiment of the invention, a process for forming a single crystal silicon ingot from varying sized pieces of polycrystalline silicon source material according to the Czochralski method comprises:

(A) placing into a crucible on the bottom a generally polygonal-shaped concentric array of rod-shaped polycrystalline silicon pieces having obliquely cut ends, (B) placing into the crucible irregular shaped pieces of polycrystalline silicon, (C) melting the polycrystalline silicon within the crucible in an inert environment at an elevated temperature to form a source melt, (D) stabilizing the temperature of the crucible and the source melt to an equilibrium level suitable for crystal growth, and (E) pulling a single crystal silicon ingot from the source melt according to the Czochralski method.

In this embodiment, process steps (A) and (B) are as described above and steps (C) through (E) can be performed by standard processes for performing the Czochralski method. Such processes for performing the Czochralski method are described in the background patents described herein, which are hereby incorporated by reference for such teachings. A general overview of the Czochralski method is provided by Zulehner, *Historical Overview of Silicon Crystal Pulling Development*, Material Science and Engineering B73 (2000) p. 7–15.

In an alternative embodiment of the invention, a process for forming a single crystal silicon ingot from varying sized pieces of polycrystalline silicon source material according to the Czochralski method comprises:

(a) placing into a crucible on the bottom a substantially parallel array of rod-shaped polycrystalline silicon pieces having obliquely cut ends, (b) placing into the crucible irregular shaped pieces of polycrystalline silicon, (c) melting the polycrystalline silicon within the crucible in an inert environment at an elevated temperature to form a source melt, (d) stabilizing the temperature of the crucible and the source melt to an equilibrium level suitable for crystal growth, and (e) pulling a single crystal silicon ingot from the source melt according to the Czochralski method.

The following examples are provided to illustrate the present invention. The examples are not intended to limit the scope of the claims herein.

EXAMPLES

Example 1. Into a clear acrylic tube about 45 cm in height and having an inside diameter of 45 cm was placed two octagonal arrays of polycrystalline silicon pieces as illustrated in FIG. 2. The sizes of the pieces-are as illustrated in FIGS. 3a and 3b. In FIG. 2 the outer octagonal array comprises 7 silicon pieces as illustrated in FIG. 3a and one silicon piece as illustrated in FIG. 3b. The inner octagonal array comprises 8 silicon pieces as illustrated in FIG. 3b. The space between and around the pieces of polycrystalline silicon forming the two octagonal arrays was then filled with irregular shaped pieces of polycrystalline silicon have an average size distribution of 10 mm to 45 mm in the largest dimension. The volume occupied by the total silicon pieces added to the tube was determined along with the weight and used to calculate the percent density of the silicon packing. The time required to fill the tube to the measured volume was also measured. The total fill weight of silicon was 30 kg. The results of these measurements are provided in Table 1.

Reference example 1. Into the acrylic tube described in Example 1 was loaded a mixture of irregular shaped polycrystalline silicon pieces have a size distribution of 6 mm to 40 mm in the largest dimension. The tube was loaded to approximately the same weight as in example 1 and the volume determined. The percent density of the silicon packing as well as the time to load was determined and are reported in Table 1.

TABLE 1

| | Avg. %<br>Density | Avg. Load<br>Time (Minutes) | No.<br>Test |
| --- | --- | --- | --- |
| Example 1 | 69.6 | 15 | 5 |
| Ref. Example 1 | 50.2 | 37 | 6 |

I claim:

1. A process for forming a single crystal silicon ingot from varying sized pieces of polycrystalline silicon source material according to the Czochralski method comprising placing into a crucible on the bottom a generally polygonal-shaped concentric array of rod-shaped polycrystalline silicon pieces having obliquely cut ends.

2. A process for forming a single crystal silicon ingot according to claim 1, where two generally polygonal-shaped concentric array of rod-shaped polycrystalline silicon pieces having obliquely cut ends are placed on the bottom of the crucible.

3. A process for forming a single crystal silicon ingot according to claim 1 comprising at least two generally polygonal-shaped concentric array of rod-shaped polycrystalline pieces having obliquely cut ends, where at least one concentric array is stacked on top of a second concentric array.

4. A process for forming a single crystal silicon ingot according to claim 1, where the polygonal-shaped concentric array is octagonal shaped.

5. A process for forming a single crystal silicon ingot according to claim 1 further comprising adding to the crucible polycrystalline silicon pieces to fill voids.

6. A process for forming a single crystal silicon ingot according to claim 5 where the polycrystalline silicon pieces comprise irregular shaped polycrystalline silicon chunks having a size distribution about 1 mm to about 125 mm in largest dimension.

7. A process for forming a single crystal silicon ingot from varying sized pieces of polycrystalline silicon source material according to the Czochralski method, comprising (A) placing into a crucible on the bottom a generally polygonal-shaped concentric array of rod-shaped polycrystalline silicon pieces having obliquely cut ends, (B) placing into the crucible irregular shaped pieces of polycrystalline silicon, (C) melting the polycrystalline silicon within the crucible in an inert environment at an elevated temperature to form a source melt, (D) stabilizing the temperature of the crucible and the source melt to an equilibrium level suitable for crystal growth, and (E) pulling a single crystal silicon ingot from the source melt according to the Czochralski method.

8. A process for forming a single crystal silicon ingot according to claim 7 where two generally polygonal-shaped concentric array of rod-shaped polycrystalline silicon pieces having obliquely cut ends are placed on the bottom of the crucible.

9. A process for forming a single crystal silicon ingot according to claim 7 comprising at least two generally polygonal-shaped concentric array of rod-shaped polycrystalline pieces having obliquely cut ends, where at least one concentric array is stacked on top of a second concentric array.

10. A process for forming a single crystal silicon ingot according to claim 7, where the polygonal-shaped concentric array is octagonal shaped.

11. A process for forming a single crystal silicon ingot according to claim 7 further comprising adding to the crucible polycrystalline silicon pieces to fill voids.

12. A process for forming a single crystal silicon ingot according to claim 11 where the polycrystalline silicon pieces comprise irregular shaped polycrystalline silicon chunks having a size distribution of about 1 mm to about 125 mm in largest dimension.

13. A process for forming a single crystal silicon ingot from varying sized pieces of polycrystalline silicon source material according to the Czochralski method comprising placing into a crucible on the bottom a generally parallel array of rod-shaped polycrystalline silicon pieces having obliquely cut ends.

14. A process for forming a single crystal silicon ingot according to claim 13, one or more layers of generally parallel arrays of cut rods are stacked on top of the generally parallel array placed on the bottom of the crucible.

15. A process for forming a single crystal silicon ingot according to claim 13, where the generally parallel array comprises at least about 4 cut rods.

16. A process for forming a single crystal silicon ingot according to claim 13 further comprising adding to the crucible polycrystalline silicon pieces to fill voids.

17. A process for forming a single crystal silicon ingot according to claim 16 where the polycrystalline silicon pieces comprise irregular shaped polycrystalline silicon chunks having a size distribution of about 1 mm to about 125 mm in largest dimension.

18. A process for forming a single crystal silicon ingot from varying sized pieces of polycrystalline silicon source material according to the Czochralski method, comprising
   (a) placing into a crucible on the bottom a substantially parallel array of rod-shaped polycrystalline silicon pieces having obliquely cut ends,
   (b) placing into the crucible irregular shaped pieces of polycrystalline silicon,
   (c) melting the polycrystalline silicon within the crucible in an inert environment at an elevated temperature to form a source melt,
   (d) stabilizing the temperature of the crucible and the source melt to an equilibrium level suitable for crystal growth, and
   (e) pulling a single crystal silicon ingot from the source melt according to the Czochralski method.

19. A process for forming a single crystal silicon ingot according to claim 18 where one or more layers of generally parallel arrays of cut rods are stacked on top of the generally parallel array placed on the bottom of the crucible.

20. A process for forming a single crystal silicon ingot according to claim 18, where the generally parallel array comprises at least about 4 cut rods.

21. A process for forming a single crystal silicon ingot according to claim 18 further comprising adding to the crucible polycrystalline silicon pieces to fill voids.

22. A process for forming a single crystal silicon ingot according to claim 21 where the polycrystalline silicon pieces comprise irregular shaped polycrystalline silicon chunks having a size distribution of about 1 mm to about 125 mm in largest dimension.

* * * * *